US006671177B1

(12) United States Patent
Han

(10) Patent No.: US 6,671,177 B1
(45) Date of Patent: Dec. 30, 2003

(54) GRAPHICS CARD APPARATUS WITH IMPROVED HEAT DISSIPATION

(75) Inventor: Tai Sheng Han, Fullerton, CA (US)

(73) Assignee: EVGA.com Corporation, Brea, CA (US)

(*) Notice: Subject to any disclaimer, the term of this patent is extended or adjusted under 35 U.S.C. 154(b) by 0 days.

(21) Appl. No.: 10/280,798

(22) Filed: Oct. 25, 2002

(51) Int. Cl.[7] ................................................. H05K 7/20
(52) U.S. Cl. ...................... 361/719; 165/80.3; 257/722; 361/697
(58) Field of Search ................................. 361/694–697, 361/687, 703–705, 717–719, 720; 454/184; 312/236; 174/16.1, 16.3; 257/722; 165/80.3, 185, 121–126

(56) References Cited

U.S. PATENT DOCUMENTS

| | | | | |
|---|---|---|---|---|
| 5,793,608 A | * | 8/1998 | Winick et al. ............... | 361/695 |
| 6,023,413 A | * | 2/2000 | Umezawa .................... | 361/697 |
| 6,157,538 A | * | 12/2000 | Ali et al. ..................... | 361/704 |
| 6,452,797 B1 | * | 9/2002 | Konstad ....................... | 361/695 |
| 6,549,404 B1 | * | 4/2003 | Kitahara et al. ............ | 361/695 |

OTHER PUBLICATIONS

USPGPUB 2002/0191430 A1, Meir, Jun. 1, 2001.*
USPGPUB 2002/0172008 A1 Michael, Nov. 21, 2002.*
USPGPUB 2003/0030980 A1, Bird, Aug. 8, 2002.*

* cited by examiner

Primary Examiner—Gerald Tolin
(74) Attorney, Agent, or Firm—Burns, Doane, Swecker & Mathis LLP; Claude A. S. Hamrick

(57) ABSTRACT

Graphics card apparatus with improved heat dissipation and including a planar metallic cover plate having an external perimeter configuration that generally corresponds to the plan-form of the printed circuit board used in the graphics card assembly, a plurality of thermal transfer blocks that can be selectively affixed to sources of thermal energy on the graphics card assembly and thermally coupled to the cover plate, and a fan and carriage therefor comprised of a heat sink and flow directing structure. Heat generated by the active board elements is transferred to the thermal blocks, sinked in part to the cover plate and ultimately removed from blocks and plate by air flow drawn into and through thermal baffles or vanes in the cooling structure. The outer surface of the cover plate also provides a broad surface upon which the manufacturer or marketer can display artwork, trademarks or other decorative indicia.

21 Claims, 6 Drawing Sheets

GRAPHICS CARD APPARATUS WITH IMPROVED HEAT DISSIPATION

FIELD OF THE INVENTION

The present invention relates generally to graphics card apparatus and more particularly to an improved graphics card assembly having a cosmetic cover plate and heat sink, individual heat transfer blocks, and a fan assembly including thermal transfer mass and flow directing baffles, or alternatively, a sub-assembly for addition to a graphics card, such sub-assembly including a cosmetic cover plate and heat sink, individual heat transfer blocks, and a fan and carriage therefor including thermal transfer mass and flow directing baffles.

BACKGROUND OF THE INVENTION

In order to enable desktop and other computers to rapidly process graphics and game technology, add-on units generally referred to as "graphics cards" or "VGA cards" are often installed in computer devices. Such cards include a separate processor, called a GPU, one or more memory chips, and other required circuitry, all mounted to a circuit board including an edge connector that is adapted to plug into an available slot in the associated computer device. Such cards often have extremely large computing power and, as a consequence, generate substantial heat that if not dissipated will adversely affect operation of the graphics card. Heretofore, various approaches have been tried to dissipate or otherwise remove heat from the thermal energy generating components and normally include some type of fan for blowing air across the active components, and perhaps some type of thermal mass capable of sinking the heat generated. To date, however, the efficiency of such devices has not been optimal. Furthermore, the design of such devices has not been aesthetically complimentary to the graphics card assembly from a marketing standpoint. There is thus a need for an improved heat extraction or dissipation mechanism, which can be added to a standard graphics card to efficiently remove thermal energy generated thereby.

SUMMARY OF THE PRESENT INVENTION

It is therefore a principal object of the present invention to provide a novel thermal energy dissipation apparatus which can be added to a graphics card to improve heat removal therefrom.

Another object of the present invention to provide a graphics card assembly having a sub-assembly including a cosmetic cover plate and heat sink, individual heat transfer blocks, and a fan and carriage therefor including thermal transfer mass and flow directing baffles.

Still another object of the present invention is to provide apparatus of the type described which, in addition to removing thermal energy from the graphics card components, also contributes to the overall cosmetic appearance of the graphics card assembly.

Yet another object of the present invention is to provide an apparatus of the type described including a cover plate having a large planar exterior surface upon which decorative graphics can be affixed, inscribed or otherwise placed as a means of improving customer appeal.

Briefly, a presently preferred embodiment of the present invention includes a planar metallic cover plate having an external perimeter configuration that generally corresponds to the plan-form of the printed circuit board used in the graphics card assembly to which it is to be affixed. The embodiment also includes a plurality of thermal transfer blocks that can be selectively affixed to sources of thermal energy on the graphics card assembly and thermally coupled to the cover plate. And finally, the embodiment includes a fan and carriage therefor comprised of a heat sink and flow directing structure. Heat generated by the active board elements is transferred to the thermal blocks, sinked in part to the cover plate and removed from blocks and plate by the airflow drawn into and forced through thermal baffles or vanes in the cooling structure. The outer surface of the cover plate also provides a broad surface upon which the manufacturer or marketer can display artwork, trademarks or other decorative indicia.

An important advantage of the present invention is that the cooling fan is asymmetrically disposed relative to the GPU, the principal heat generating unit, and a large part of the cooling fluid flow is passed over a heat sinking structure that is in direct thermal engagement with the GPU.

Another advantage of the present invention is that the thermal transfer blocks transfer thermal energy to the large cover plate as well as experience energy transfer to the airflow passing therethrough from the fan.

Still another advantage of the present invention is that the external cover plate provides a broad heat dissipating surface conforming to the principal plan-form of the VGA card and, in addition to removing thermal energy from the card, also provides a flat surface upon which decorative graphics can be displayed.

Yet another advantage of the present invention is that it provides a sub-assembly of components that can be arranged to suit a particular card design, there being substantially no limitations on the positioning of the several thermal transfer blocks.

A still further advantage of the present invention is that the cover plate provides for better capture of the thermal transfer blocks, better contact between the chips and the thermal transfer blocks, and better air flow management than in the prior art.

These and other objects of the present invention will no doubt become apparent to those skilled in the art after having read the following detailed description of preferred embodiments illustrated in the several figures of the drawing.

IN THE DRAWING

DETAILED DESCRIPTION OF THE PREFERRED EMBODIMENTS

Figure 1:
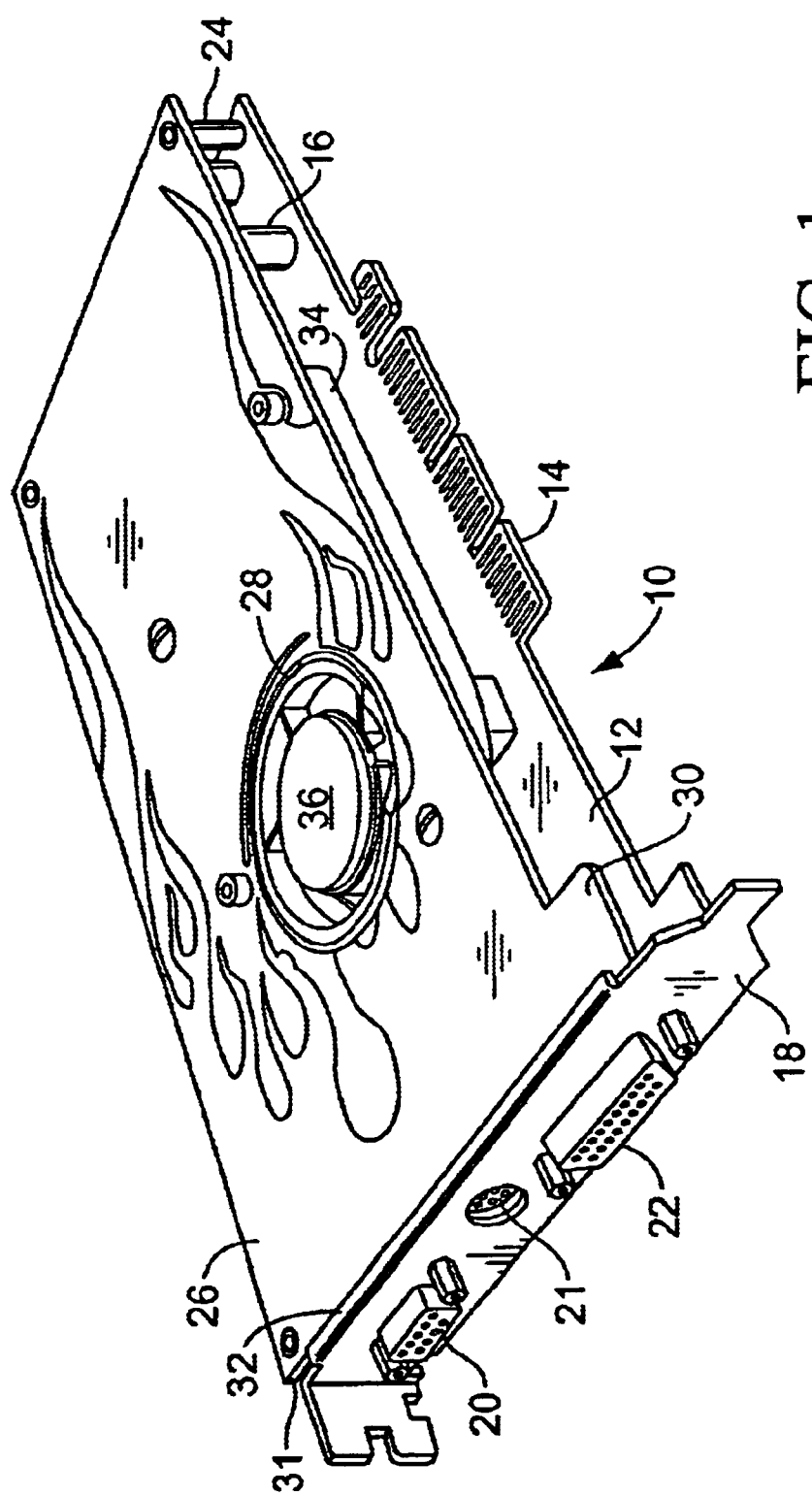
FIG. 1 is a perspective view showing a presently preferred embodiment of a graphics card assembly including a heat dissipating subassembly in accordance with the present invention.

Referring to FIG. 1 of the drawing, a graphics card assembly in accordance with the present invention is illustrated at 10 and includes a printed circuit board 12 having edge connectors 14 and populated with numerous electronic components some of which are shown at 16. The board is attached at the near end to an end plate 18 carrying various cabling connectors 20, 21 and 22 used to communicate signals into and out of the assembly. Affixed to the printed circuit board 12 by means of three vertically extending spacing legs or risers, one of which is shown at 24, is a planar, generally rectangular metal cover plate 26 having a circular aperture 28 cut therein. The foremost extremity of plate 26 includes a laterally extending tab 30 conforming to a similar tab on the board 12. The front edge of the plate 26 is captured beneath a turned back lip 32 forming a side of the end plate 18. Disposed beneath plate 26 and carried thereby is a metal fan carrier, heat sink and flow director apparatus 34 that is affixed to the bottom side of plate 26 by means of three screws (not shown). Positioned within the aperture 28 and affixed to and carried by the carrier 34 is a fan unit 36. Note that the upper surface of plate 26 is flat and ideally suited for decorative graphics, manufacturers or marketers trademarks, etc.

In use, the graphics card assembly is oriented so as to have the near right side of the assembly, as depicted, facing a slot on a computer motherboard and mounted thereto by slipping the edge connectors 14 into the slot so that the assembly communicates with devices on the motherboard via the edge connector 14. AS described in more detail below, heat generated by the electronics components of the assembly are sinked to transfer blocks (not shown), the plate 26, and the carrier 34, all of which are cooled by air flow created by the fan 36, as will also be further elucidated below.

Figure 2:
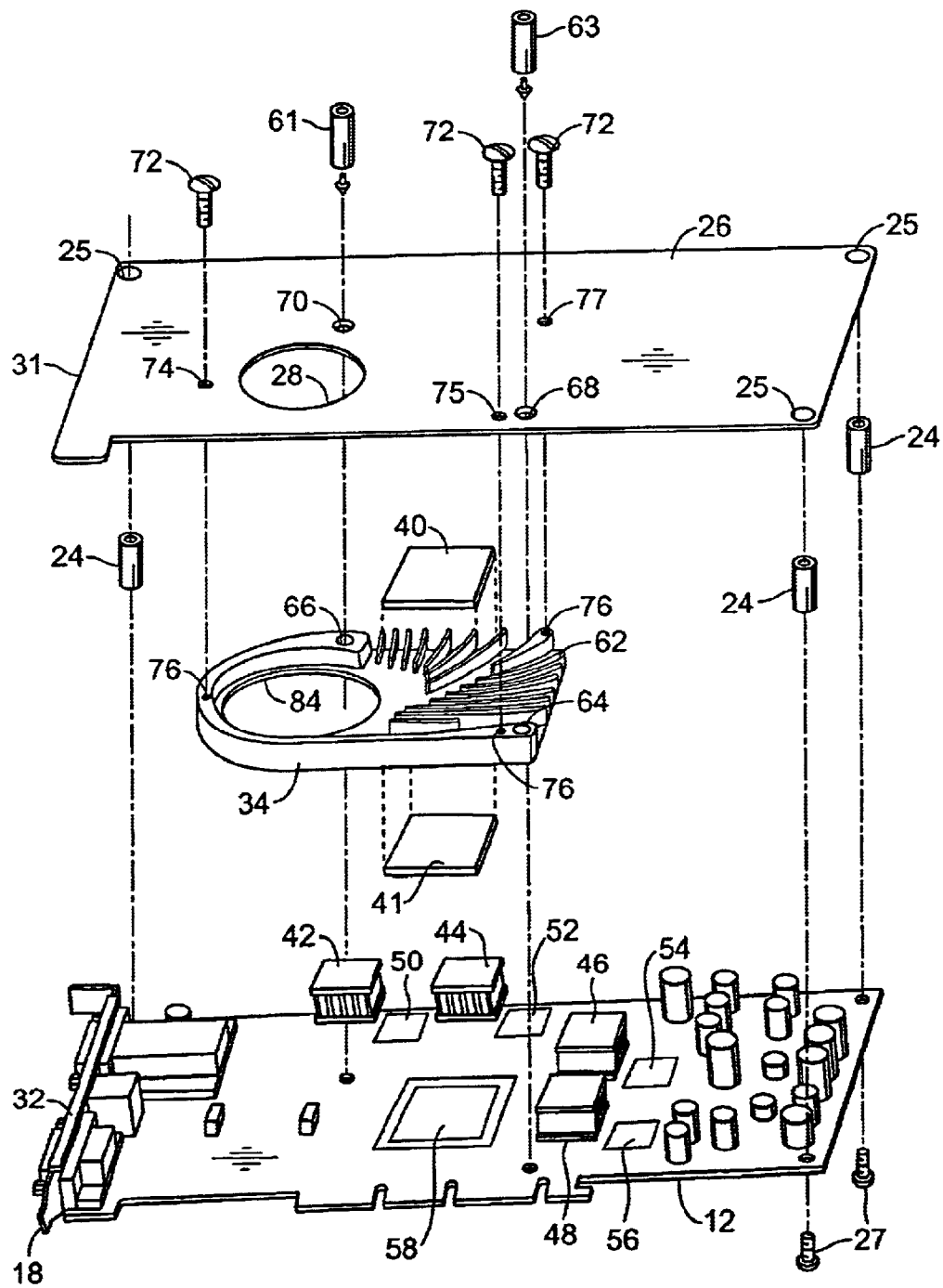
FIG. 2 is an exploded perspective view showing the several components of the assembly illustrated in FIG. 1.

In FIG. 2, the cover plate 26, risers 24 and fan carrier 34 are shown exploded away from the populated graphics card 12. For clarity, the fan 36 shown in FIG. 1 is not shown installed to its carrier 34. The particular graphics card illustrated is a model NV 30 sold by eVGA.com Corporation of Brea, CA. A pair of copper contact plates 40 and 41 shown above and below carrier 34, and four thermal transfer blocks 42–48 are also shown above graphics card 12. As will be further explained below, the transfer blocks are positioned to intimately engage the top surfaces of heat generating, active electronic components that are not shown but will be positioned at 50, 52, 54 and 56 on card 12. Similarly, a graphics processor unit (GPU) will be mounted to card 12 at 58 and the top surface thereof will be engaged by the contact plate 41 that is soldered or brazed to, or molded into the bottom of carrier 34. The other copper plate 40 is soldered or brazed to the top edges of the flow directing vanes 62 as will be further explained below.

The fan carrier 34 (with fan installed thereto—not shown) is aligned with the opening 28 and mounted to the bottom of cover plate 26 by three screws 72 passed through openings 74, 74 and 77, and threaded into threaded bores 76 tapped into the top of carrier 34. The copper plate 40 is attached to the top edges of the vanes 62 and engages the bottom of cover plate 26 to transfer thermal energy from the carrier 34 to the cover plate. As pointed out above, the second copper contact plate 41 affixed to the bottom surface of fan carrier 34 will physically engage the top of the GPU to be mounted at 58 in order to transfer heat therefrom to carrier 34.

As will also be further discussed below, the height of each one of the thermal transfer blocks 42–48 is such as to substantially span the distance between the top of a corresponding active element mounted to board 12 and the bottom surface of cover plate 26. Any gap remaining is closed by an appropriate thermally conductive compound. Plate 26 is secured to board 12 by means of the capture of edge 31 beneath lip 32 of the board end plate 18, and a force fit of the upper ends of risers 24 to openings 25 in cover plate 26. The lower ends of risers 24 are secured to board 12 by means of appropriate mounting screws 27 or other suitable fasteners. Plate 26 is prevented from bowing upwards and is in fact held in secure engagement with the tops of the blocks 42–48 by means of spring clips 61 and 63, respectively passed through openings 68 and 70 formed in plate 26, bores 64 and 66 formed on carrier 34, and corresponding openings formed in board 12.

Figure 3A:
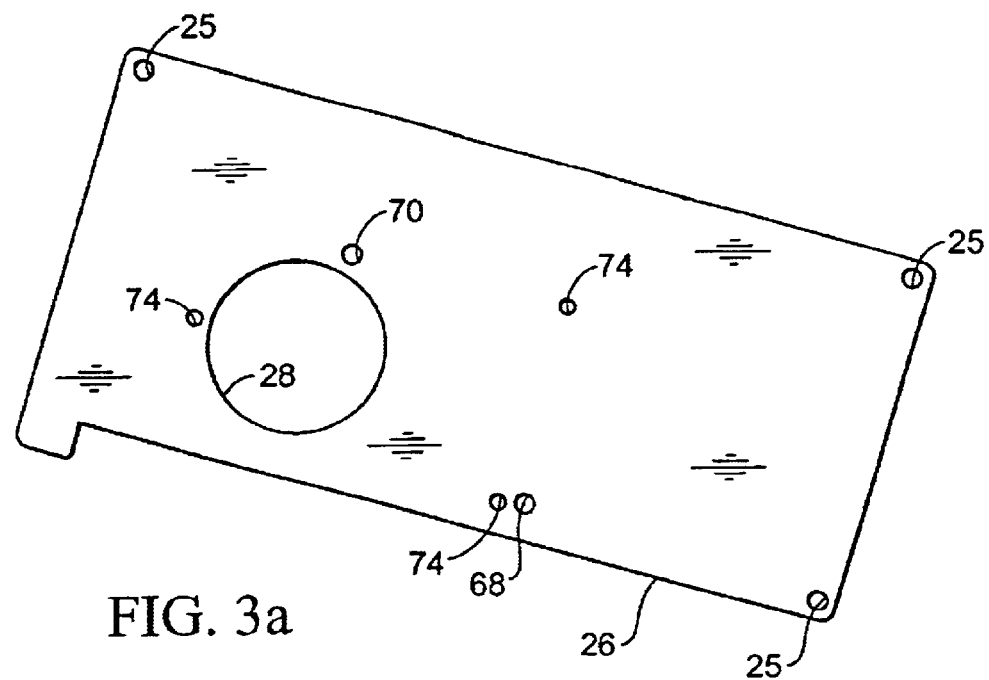
FIG. 3a is a plan view showing the top of the cover plate depicted in FIG. 2.

In FIG. 3a, the upper surface of cover plate 26 is illustrated in plan-form to more clearly show the perimeter configuration as well as the location of apertures 25, 28, 68, 70 and 74. In the illustrated embodiment plate 26 is made of sheet aluminum but alternatively could be made of steel, copper or any other suitable material capable of serving as a heat sink.

Figure 3B:
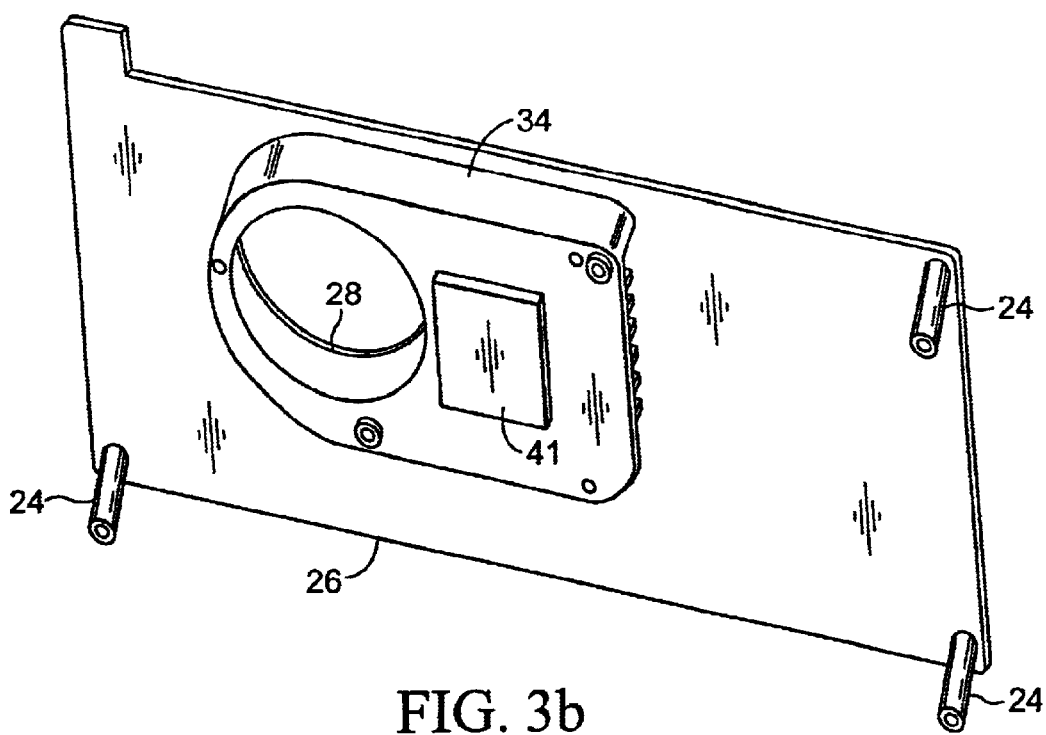
FIG. 3b is a perspective view showing the bottom of the cover plate depicted in FIG. 3a with the fan carriage and risers affixed thereto.

FIG. 3b is included to show the bottom sides of both the plate 26 and the fan carrier and heat sink 34 as well as the stand off legs 24. Note also the copper plate 41 which in the preferred embodiment is molded into the bottom of carrier 34. Alternatively it could be soldered or brazed to the bottom of carrier 34.

Figure 4:
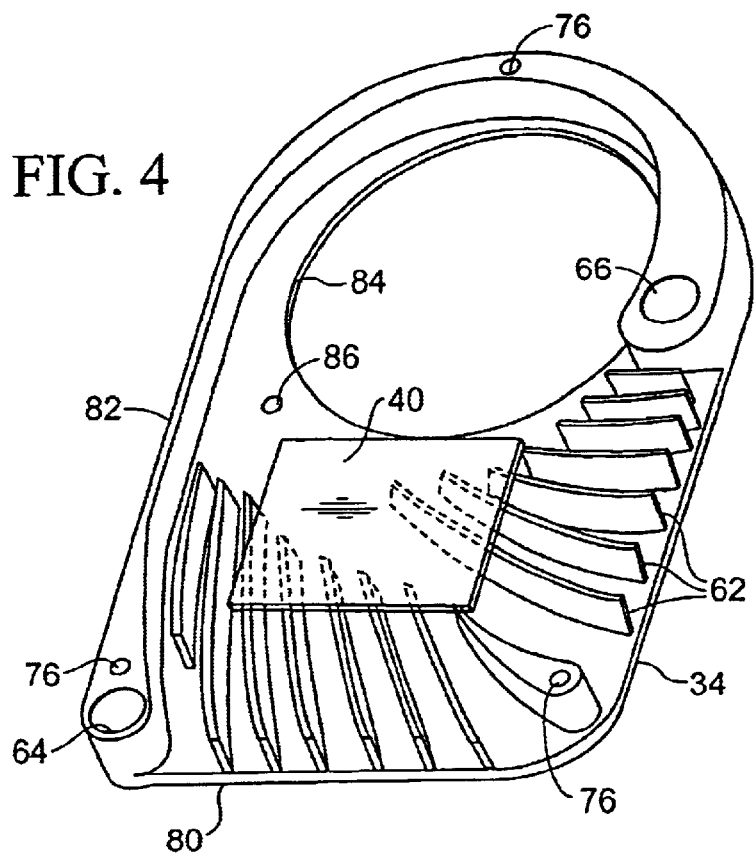
FIG. 4 is a perspective view illustrating the topside of the fan carriage and flow directing sink block structure illustrated in FIG. 2.

Turning now to FIG. 4 of the drawing, the upper side of the fan carrier, flow director and heat sink 34, and its associated thermal transfer plate 40 are illustrated. Note that carrier 34 is a single molded unit having integrally formed thermal baffles or vanes 62 standing up from a base portion 80 that is surrounded in part by an integrally formed side frame 82 that partially circumscribes the circular opening 84 through which the fan 36 (FIG. 1) draws (or alternatively exhausts) cooling air. The fan is mounted to carrier 34 by means of screws (not shown) threaded into or passing through apertures 86, one of which is illustrated. Also depicted in this view are the threaded openings 76 for facilitating mounting of the carrier to cover plate 26, and the cylindrical bores 64 and 66 that align with the openings 68 and 70 (FIG. 2) of plate 26 and receive the spring clips 61 and 63. Lying on top of the vanes 62 and positioned directly above the position of the GPU engaging plate 41 (not shown) is the copper contact plate 40 which engages and serves to transfer thermal energy passing through the vanes 62 to plate 26.

Figure 5:
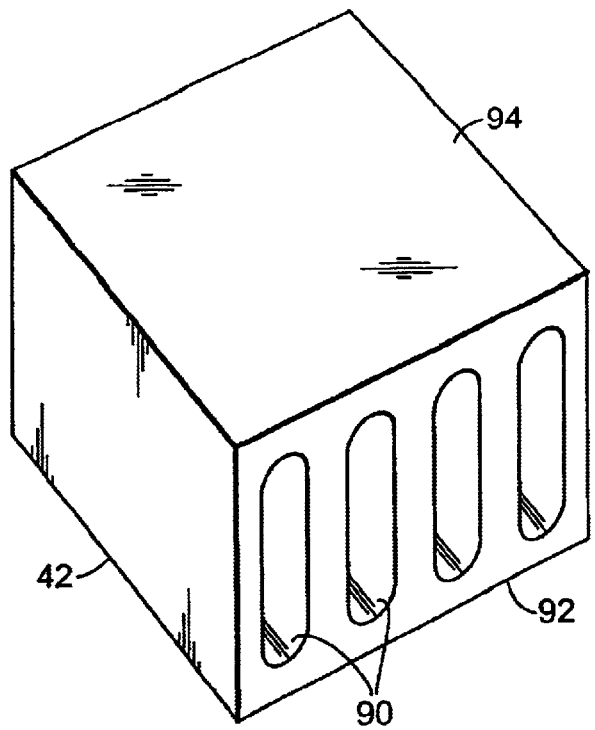
FIG. 5 is a perspective view illustrating a thermal transfer block.

In FIG. 5, an exemplary form of a simple thermal transfer blocks that might be used as one of the thermal transfer blocks 42–48 is shown at 42. In one embodiment, the blocks may be formed from an extruded section of, preferably, copper metal. However, any material having good thermal conducting characteristics may be used. The illustrated block has four elongated openings 90 passing therethrough for receiving air flow induced by the fan 36 (FIG. 1). The bottom surface 92 is planar and intended to physically engage the top surface of an active electronic element mounted on PC board 12 and transfer thermal energy therefrom. Similarly, the top surface 94 is planar and intended to engage the bottom surface of plate 26 either directly or via an appropriate heat transferring compound deposited therebetween. Air flowing through the openings or passageways 90, as well as around the sides of the block, tends to remove thermal energy as it propagates through the block from bottom to top to be sinked to cover plate 26.

Figure 6:
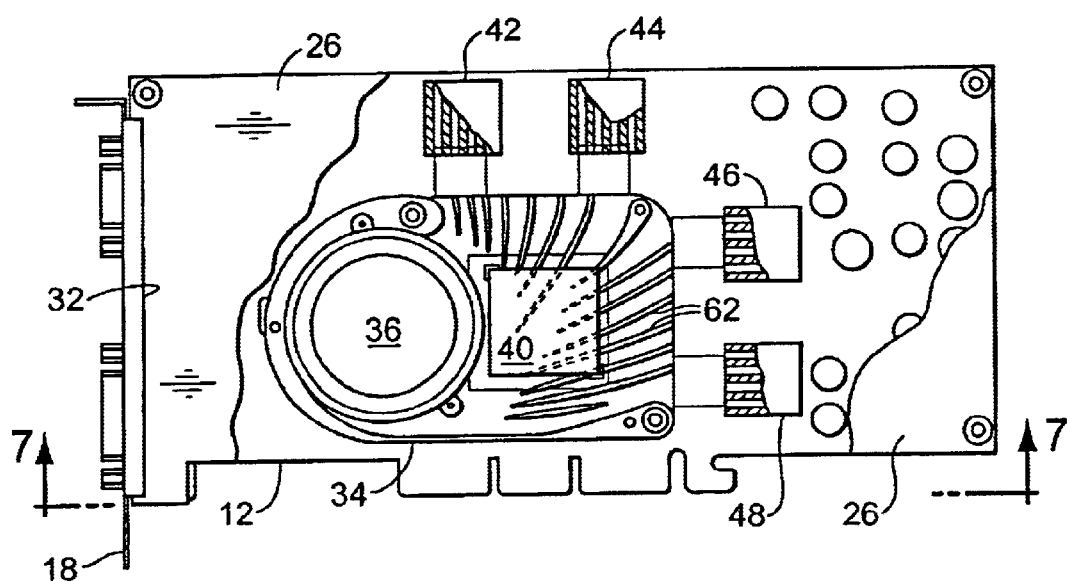
FIG. 6 is an assembly view shown in plan form with the cover plate and transfer blocks partially broken away to reveal internal detail.

In FIG. 6, the assembled card apparatus is shown from the top with the cover plate 26 partially broken away to reveal the fan carrier 34 and the thermal transfer blocks 42–48 in place on the card 12. Note that the fan 36 is asymmetrically positioned relative to the GPU (not shown, but positioned on the board 12 beneath the plate 40) so that heat transferred from the top surface of the GPU is conducted into the bottom surface of carrier 34 (via plate 41) and transferred to the base of the carrier 34 and thence to the vanes 62 which in turn transfer heat to plate 40 which in turn couples it to cover plate 26. Air drawn in through cover plate opening 28 by the fan 36 (FIG. 1) is directed through the vanes 62, drawing with it heat transferred from the bottom plate of carrier 34, the vanes 62, the bottom of plate 40, and the bottom surface of cover plate 26 before it is caused to flow through and around the thermal transfer blocks 42–48, and thence be discharged to the sides of the card assembly from beneath plate 26.

Alternatively, fan 36 could be reversed to draw air in from the open sides of the assembly through the vanes 62 and be exhausted out through the opening 28 in cover plate 26. Flow in this direction would likewise induce airflow through the passages in blocks 42–48, and may be preferable for some applications where the thermal energy generated by the components beneath the transfer blocks 42–48 is substantially less than the thermal energy generated by the GPU.

Figure 7:
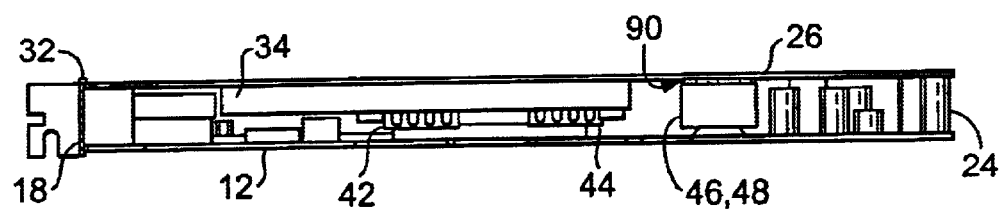
FIG. 7 is an elevational view taken along the line 7—7 of FIG. 6.

The positioning of the fan carrier 34 and blocks 42–48, as well as their relationship to plate 26 is additionally shown in FIG. 7 which is a cross-section taken along the line 7–7 in FIG. 6. Note that the gap 90, if any, between the heat transfer blocks 46, 48 (as well as the blocks ) 42, 44 will normally be filled with a suitable heat transfer compound so that thermal energy is transferred to cover plate 26 to assist in the dissipation of generated energy.

Figure 8:
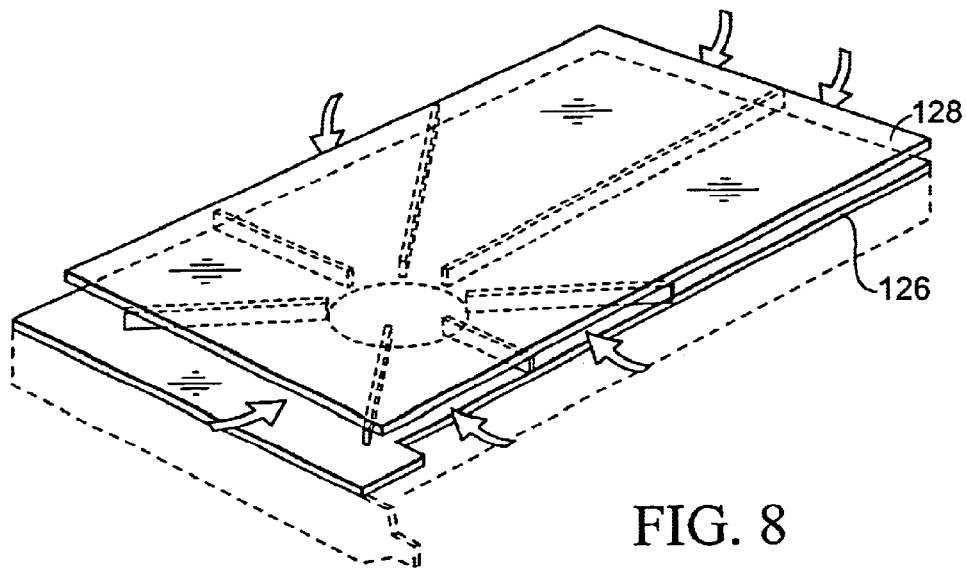
FIG. 8 is a perspective view illustrating an alternative form of cover plate.
Figure 9:
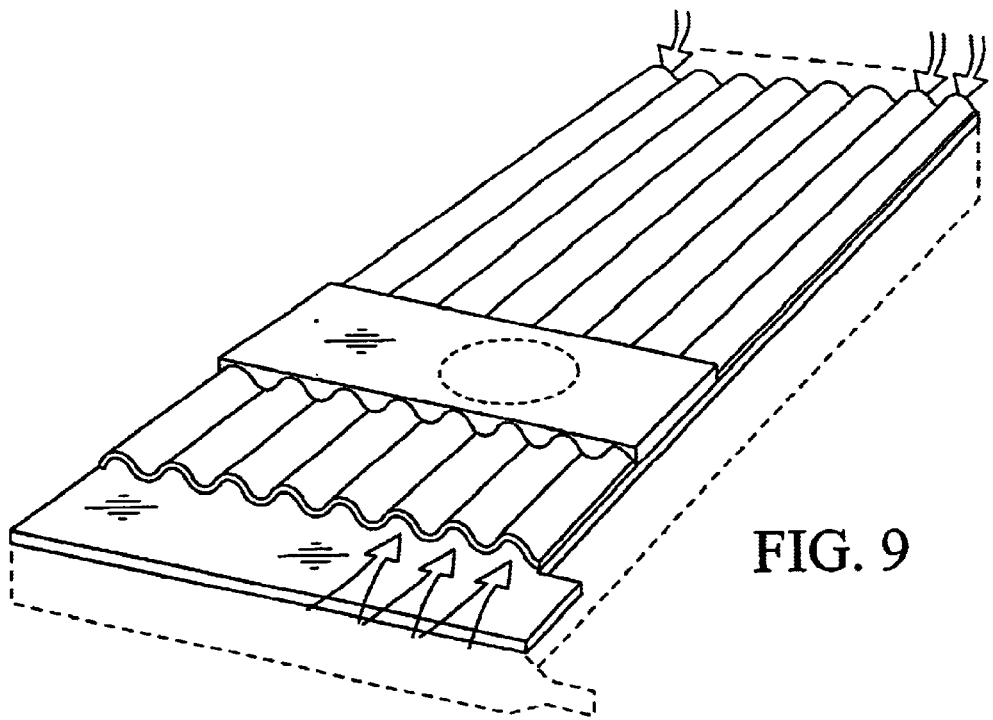
FIG. 9 is a perspective view illustrating another alternative form of cover plate.

Although the present invention has been described above in terms of particular embodiments illustrated in the several figures of the drawing, it will be appreciated that other configurations of fan carrier, flow directing vanes, thermal transfer blocks and cover plates may be utilized without departing from the essence of the present invention. For example, ribs, vanes or even simple grooves or corrugations may be provided in plate 26 in order to increase the surface area thereof. Furthermore, plate 26 may be comprised of multiple layers joined together by ribs (FIG. 8) or a flat plate combined with a corregated plate (FIG. 9) such that a flow of air therethrough is induced by fan 28 to further increase the transfer and exhaust of thermal energy from the graphics card assembly. Such configurations may be of particular interest in the case where the fan is operated in the reverse direction referred to above such that air is drawn from the perimeter of the assembly across the various components and heat transfer elements and the exhausted through passageways formed between the sandwiched plates.

Notwithstanding that the present invention has been described above in terms of several alternative embodiments, it is anticipated that still other alterations and modifications will become apparent to those skilled in the art after having read this disclosure. It is therefore intended that such disclosure be considered illustrative and not limiting, and that the appended claims be interpreted to include all such alterations, modifications and embodiments as fall within the true spirit and scope of the invention.

What is claimed is:

1. Graphics card apparatus with improved heat dissipation, comprising:
    a generally planar heat conducting cover plate for connection to a graphics card assembly;
    a plurality of thermal transfer means for selective affixation to sources of thermal energy on the graphics card assembly and adapted to be thermally coupled to said cover plate; and
    a fan and carrier therefor including a heat sink and flow directing vanes thermally coupled to and carried by said cover plate, said heat sink thermally engaging the GPU of the graphics card assembly, said vanes being configured to direct air from said fan toward said thermal transfer means;
    whereby thermal energy generated by the active board elements of the graphics card assembly is transferred to the thermal transfer means and fan carrier, sinked to the cover plate and ultimately removed from said thermal transfer means and cover plate by an air flow drawn into said flow directing structure and exhausted through said vanes.

2. Graphics card apparatus as recited in claim 1 wherein said cover plate has an external perimeter configuration generally corresponding to the plan-form of the printed circuit board of the graphics card assembly.

3. Graphics card apparatus as recited in claim 1 wherein said fan carrier includes an elongated body of thermally conductive material having an opening proximate one end thereof for accommodating said fan, a base portion proximate the opposite end adapted to engage the top of the GPU and transfer thermal energy therefrom, and a plurality of upstanding vanes formed above said base portion.

4. Graphics card apparatus as recited in claim 3 wherein said vanes are configured to direct air from said fan toward each said thermal transfer means.

5. Graphics card apparatus as recited in claim 2 and further comprising a plurality of risers disposed proximate at least some of the corners of said cover plate and adapted to secure said cover plate in spaced apart relationship to the printed circuit board.

6. Graphics card apparatus as recited in claim 1 wherein the top surface of said cover plate is adapted to receive decorative indicia, and wherein said fan is asymmetrically disposed relative to the portion of said carrier heat transferably engaging the GPU.

7. Graphics card apparatus as recited in claim 1 wherein said thermal transfer means are blocks of heat conductive material having a plurality of passageways extending therethrough for receiving cooling air from said fan.

8. Graphics card apparatus as recited in claim 7 wherein said thermal transfer blocks include a generally planer bottom surface for engaging the top surface of a memory chip package.

9. Graphics card apparatus as recited in claim 8 wherein said thermal transfer blocks include a top surface adapted to transfer thermal energy to said cover plate.

10. Graphics card apparatus as recited in claim 9 and further comprising a thermally conductive compound disposed between said top surface of said thermal transfer blocks and the bottom surface of said cover plate.

11. In a graphics card assembly including a printed circuit board with a plurality of heat generating components affixed thereto, and a heat dissipating mechanism also affixed to said printed circuit board for removing thermal energy from the heat generating components, an improved heat dissipating mechanism comprising:

a generally planar heat conducting cover plate;

a plurality of thermal transfer means affixed to the heat generating components and heat transferably coupled to said cover plate; and a fan and carrier therefor including a heat sink and flow directing vanes heat transferably coupled to and carried by said cover plate, said heat sink heat transferably engaging the GPU of the graphics card assembly, said vanes being configured to direct air from said fan toward said thermal transfer means;

whereby thermal energy generated by the active board elements of the graphics card assembly is transferred to the thermal transfer means and fan carrier, sinked to the cover plate, and ultimate removed from said fan carrier, said thermal transfer means and said cover plate by an air flow drawn into said flow directing structure and exhausted through said vanes.

12. In a graphics card assembly as recited in claim 11 wherein said cover plate has a fan accommodating opening formed therein and an external perimeter configuration generally corresponding to the plan-form of the printed circuit board of the graphics card assembly.

13. In a graphics card assembly as recited in claim 11 wherein said fan carrier includes an elongated body of thermally conductive material having an opening proximate one end thereof for accommodating said fan, a base portion proximate the opposite end adapted to engage the top of the GPU and transfer thermal energy therefrom, and a plurality of upstanding vanes formed above said base portion.

14. In a graphics card assembly as recited in claim 13 wherein said vanes are configured to direct air from said fan toward each said thermal transfer means.

15. In a graphics card assembly as recited in claim 12 and further comprising a plurality of risers disposed proximate at least some of the corners of said cover plate and adapted to secure said cover plate in spaced apart relationship to the printed circuit board.

16. In a graphics card assembly as recited in claim 11 wherein the top surface of said cover plate is adapted to receive decorative indicia.

17. In a graphics card assembly as recited in claim 11 wherein said thermal transfer means include blocks of heat conductive material having a plurality of passageways extending therethrough for receiving cooling air from said fan.

18. In a graphics card assembly as recited in claim 17 wherein said thermal transfer blocks include a generally planer bottom surface for engaging the top surface of a memory chip package.

19. In a graphics card assembly as recited in claim 18 wherein said thermal transfer blocks include a top surface adapted to transfer thermal energy to said cover plate.

20. In a graphics card assembly as recited in claim 19 and further comprising a thermally conductive compound disposed between said top surface of said thermal transfer blocks and the bottom surface of said cover plate.

21. In a graphics card assembly as recited in claim 11 wherein said fan is asymmetrically disposed relative to the portion of said carrier heat transferably engaging the GPU.

* * * * *